US008840200B2

(12) United States Patent
Chen

(10) Patent No.: US 8,840,200 B2
(45) Date of Patent: Sep. 23, 2014

(54) ELECTRONIC DEVICE AND MOVABLE FIXING STRUCTURE THEREOF

(71) Applicants: Inventec (Pudong) Technology Corporation, Shanghai (CN); Inventec Corporation, Taipei (TW)

(72) Inventor: Chien-Hung Chen, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 13/794,003

(22) Filed: Mar. 11, 2013

(65) Prior Publication Data

US 2014/0084771 A1  Mar. 27, 2014

(30) Foreign Application Priority Data

Sep. 25, 2012  (CN) .......................... 2012 1 0362407

(51) Int. Cl.
*H05K 5/00* (2006.01)
*H05K 5/02* (2006.01)

(52) U.S. Cl.
CPC .................................. *H05K 5/0221* (2013.01)
USPC ..................................................... 312/223.2

(58) Field of Classification Search
USPC ............ 312/223.2, 222; 292/163, 175, 251.5, 292/DIG. 11
See application file for complete search history.

(56) References Cited

U.S. PATENT DOCUMENTS

| 5,608,980 | A  | * | 3/1997  | Pangerl ........................... 40/793 |
| 7,154,745 | B1 | * | 12/2006 | Wu ........................... 361/679.21 |
| 7,184,262 | B2 | * | 2/2007  | Hsu et al. ................. 361/679.27 |
| 7,410,194 | B2 | * | 8/2008  | Chen et al. ...................... 292/37 |
| 7,543,862 | B2 | * | 6/2009  | Lin ........................... 292/251.5 |
| 7,841,632 | B2 | * | 11/2010 | Tracy et al. .................... 292/163 |
| 7,934,780 | B2 | * | 5/2011  | McBroom et al. .......... 312/223.2 |
| 2006/0006674 | A1 | * | 1/2006 | Kang et al. ................. 292/251.5 |
| 2008/0218953 | A1 | * | 9/2008 | Yun et al. ...................... 361/681 |
| 2009/0051174 | A1 | * | 2/2009 | Ho ............................. 292/251.5 |
| 2013/0107431 | A1 | * | 5/2013 | Xu ........................... 361/679.01 |

* cited by examiner

*Primary Examiner* — Daniel Rohrhoff
(74) *Attorney, Agent, or Firm* — Morris Manning & Martin LLP; Tim Tingkang Xia, Esq.

(57) ABSTRACT

A movable fixing structure is used for causing the first casing to be combined with or detached from the second casing along a first axial direction. The movable fixing structure includes a blocking component, a locating element and a limiting element. The blocking component is movably disposed on the first casing along a second axial direction. The blocking component is used for moving between a first position and a second position. The locating element has a first locating portion and a second locating portion. The locating element is disposed on the first casing and is used for moving between a third and a fourth position along a third axial direction. The limiting element is disposed on the second casing and is used for interfering with the second locating portion on the first axial direction.

8 Claims, 5 Drawing Sheets

ELECTRONIC DEVICE AND MOVABLE FIXING STRUCTURE THEREOF

CROSS-REFERENCE TO RELATED APPLICATIONS

This non-provisional application claims priority under 35 U.S.C. §119(a) on Patent Application No(s). 201210362407.X filed in China, P.R.C. on Sep. 25, 2012, the entire contents of which are hereby incorporated by reference.

TECHNICAL FIELD OF THE INVENTION

The disclosure relates to a movable fixing structure, more particularly to a movable fixing structure configured for fixing two casings and an electronic device applying the movable fixing structure.

DESCRIPTION OF THE RELATED ART

As the technology industry advances these days, electronic devices such as the notebook (NB), the Personal Digital Assistant (PDA) and the smart phone become commonplace in people's daily life. There are more and more new applications and functions of the electronic device. In addition, the convenience and the usefulness make these electronic devices become more popular and commonly used.

Take the notebook as an example. The assembly of the casings is usually carried out by fastening. Elastic arms and hooks are often used as the corresponding structures for assembly and disassembly. However, a slim design is the current trend of the design of notebooks. For the purpose of the slim design, the space in the casing of the notebook is inevitably minimized. Thus, how to offer an appropriate fixing structure applicable for a limited space becomes a crucial issue to be addressed.

SUMMARY OF THE INVENTION

In an embodiment, the disclosure provides a movable fixing structure configured for being disposed between a first casing and a second casing. The movable fixing structure is configured for causing the first casing to be combined with or detached from the second casing along a first axial direction. The movable fixing structure comprises a blocking component, a locating element and a limiting element. The blocking component is movably disposed on the first casing along a second axial direction. The blocking component is configured for moving between a first position and a second position. The locating element has a first locating portion and a second locating portion. The locating element is disposed on the first casing and configured for moving between a third position and a fourth position along a third axial direction. The first axial direction, the second axial direction and the third axial direction are perpendicular to each other. The limiting element is disposed on the second casing and is configured for interfering with the second locating portion on the first axial direction. When the blocking component is at the first position, the locating element is limited at the third position by the blocking component and the locating element is interfered with the second locating portion by the blocking component, so that the first casing is constrained to move away from the second casing along the first axial direction. When the blocking component is at the second position, the locating element is configured for moving to the fourth position, so as to release the interference between the limiting element and the second locating portion.

The disclosure further provides an electronic device comprising a first casing, a second casing and a movable fixing structure. The second casing is configured for connecting with the first casing. The movable fixing structure is configured for being disposed between a first casing and a second casing. The movable fixing structure is configured for causing the first casing to combine with or detach from the second casing along a first axial direction. The fixing structure comprises a blocking component, a locating element and a limiting element. The blocking component is movably disposed on the first casing along a second axial direction. The blocking component is configured for moving between a first position and a second position. The locating element has a first locating portion and a second locating portion. The locating element is disposed on the first casing and is configured for moving between a third position and a fourth position along a third axial direction. The first axial direction, the second axial direction and the third axial direction are perpendicular to each other. The limiting element is disposed on the second casing and is configured for interfering with the second locating portion on the first axial direction. When the blocking component is at the first position, the locating element is limited at the third position by the blocking component and the locating element is interfered with the second locating portion by the blocking component, so that the first casing is constrained to move away from the second casing along the first axial direction. When the blocking component is at the second position, the locating element is configured for moving to the fourth position, so as to release the interference between the limiting element and the second locating portion.

BRIEF DESCRIPTION OF THE DRAWINGS

The disclosure will become more fully understood from the detailed description given herein below for illustration only and thus does not limit of the disclosure, wherein.

DETAILED DESCRIPTION

Figure 1A:
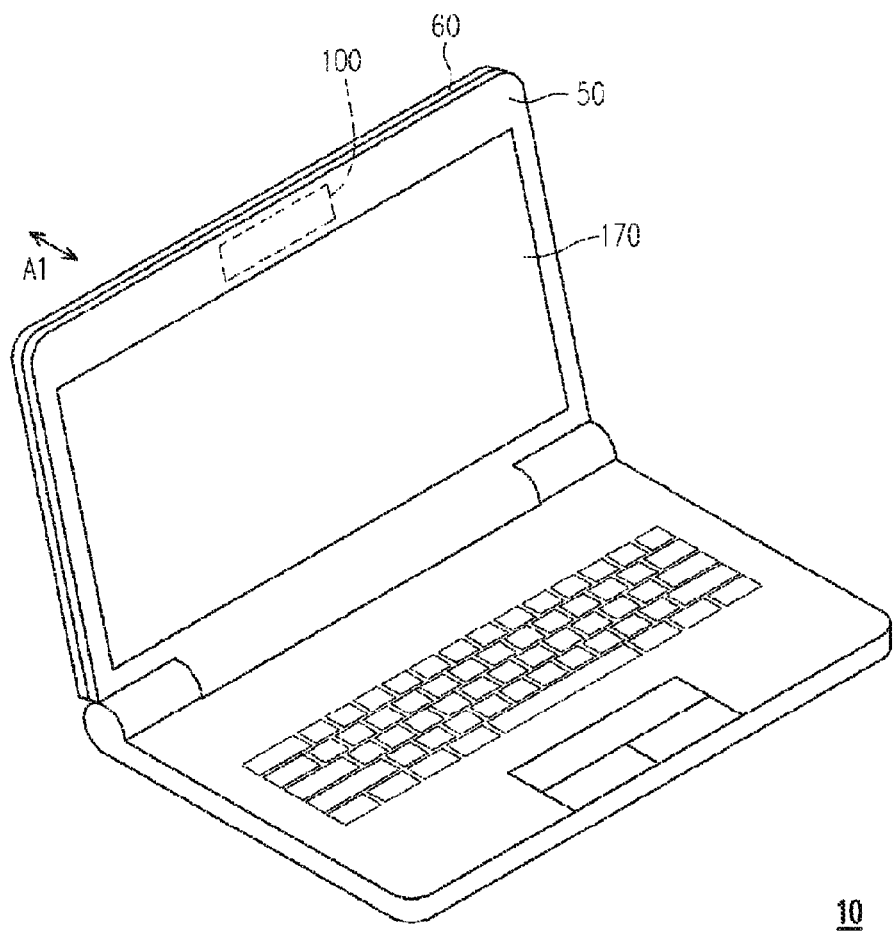
FIG. 1A is a perspective view of a electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a perspective view of an electronic device according to an embodiment of the disclosure. The structure inside the device is shown in dotted lines. Please refer to FIG. 1A. The electronic device 10 is, for example, a notebook. The electronic device 10 comprises a first casing 50, a second casing 60 and a movable fixing structure 100. The first casing 50 and the second casing 60 are connected with each other in order to fix a display unit 170 between them. The movable fixing structure 100 is configured for being disposed on the first casing 50 and the second casing 60, so as to cause the first casing 50 to connect with or detach from the second casing 60 along a first axial direction A1.

In this embodiment, the first axial direction is at the thickness direction of the first casing 50 and the second casing 60. The types of the first casing 50 and the second casing 60 are not intended to limit the disclosure. In other embodiments, the first casing 50 and the second casing 60 may be the two casings of a tablet.

Figure 1B:
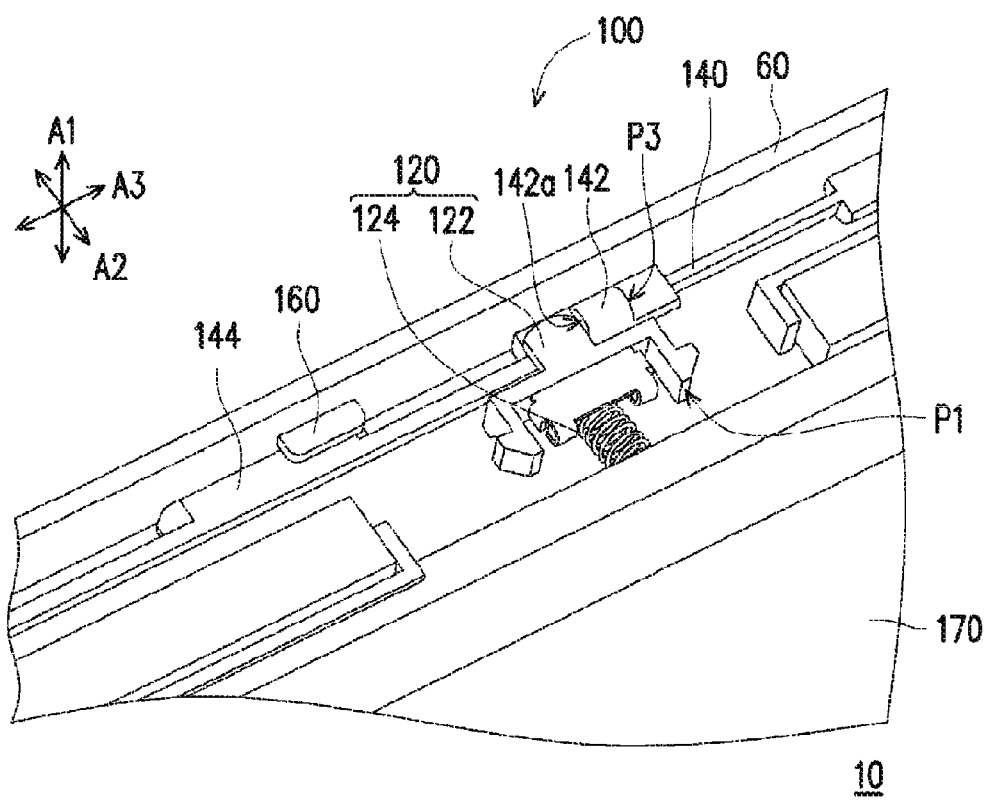
FIG. 1B is a perspective view of a movable fixing structure in FIG. 1A in a fixed condition.

FIG. 1B is a perspective view of a movable fixing structure in FIG. 1A in a fixed condition. The first casing 50 is omitted to show the movable fixing structure 100 more clearly. Please refer to FIG. 1B, the movable fixing structure 100 comprises a blocking component 120, a locating element 140 and a limiting element 160. The blocking component 120 is movably disposed on the first casing 50 and is configured for moving along a second axial direction A2. The locating element 140 is movably disposed on the first casing 50 and is configured for moving along a third axial direction A3. The locating element comprises a first locating portion 142 and a second locating portion 144. The first axial direction A1, the second axial direction A2 and the third axial direction A3 are perpendicular to each other. The limiting element 160 is disposed on the second casing 60 and is configured for being interfered with the second locating portion 144 along the first axial direction A1.

Please refer to 1B. When the blocking component 120 is at the first position P1, the blocking component 120 causes the locating element 140 to be limited at the third position P3, and causes the limiting element 160 to be interfered with the second locating portion 144, so as to limit the first casing 50 to move away from the second casing 60 along the first axial direction A1. Thereby, the function that the first casing 50 is fastened with the second casing 60 is performed.

In this embodiment, the locating element 140 is magnetic or has magnetic conductivity such as iron or other materials having magnetic conductivity. Thereby, users are able to utilize magnets (not shown in the figures) to attract the locating element 140 outside the first casing 50, and further make the locating element 140 move along the third axial direction A3 by the magnetic force. Moreover, as shown in FIG. 1B, the locating element is a rectangular structure disposed along the edge of the first casing 50.

Please refer to FIG. 1B. Specifically, the blocking component comprises a blocking element 122 and a repositioning element 124. The blocking element 122 is configured for interfering with the first locating portion 142. The repositioning element is, for example, a spring disposed between the blocking element 122 and the first casing 50. Additionally, the repositioning element 124 is configured for causing the blocking element 122 to move to the locating element 140 along the second axial direction A2. In this embodiment, being the same as the locating element 140, the blocking element 122 is magnetic or has magnetic conductivity, so users are able to utilize magnets to attract the blocking element 122 outside the first casing 50, so as to make the blocking element 122 move along the second axial direction A2 by the magnetic force.

According to above-mentioned embodiments, when users intend to detach the first casing 50 from the second casing 60, magnets can be used to attract the locating element 140 and the blocking element 122 in order to move them. FIG. 2A to FIG. 2D are perspective views of the movable fixing structure in FIG. 1A from the fixed condition to a released condition. Along with the figures, the movable fixing structure 100 from the fixed condition to the released condition is illustrated hereinafter.

Figure 2A:
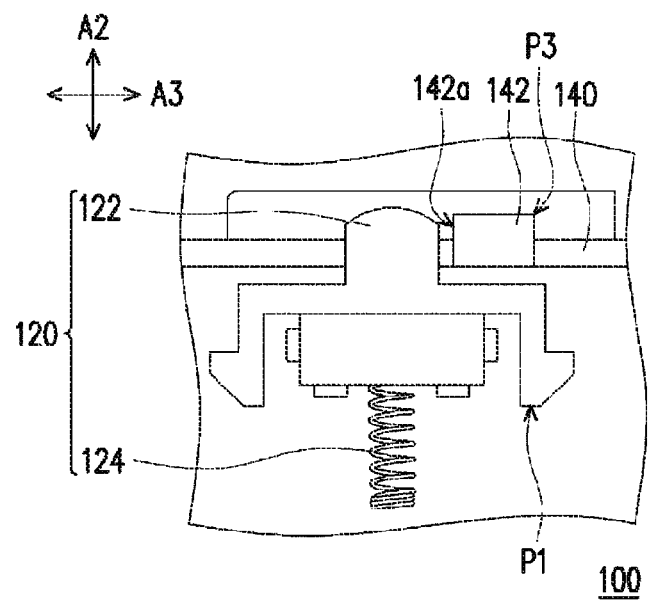
FIG. 2A to FIG. 2D are perspective views of the movable fixing structure in FIG. 1A from the fixed condition to a released condition.

In FIG. 2A, the movable fixing structure is in the fixed condition, and the blocking component 120 is at the first position P1 while the locating element 140 is at the third position P3. The blocking element 122, in the mean time, is interfered by the first locating portion 142. In this condition, the blocking component 120 is located between the limiting element 160 and the locating element 140 (as shown in FIG. 1B), and the blocking element 122 leans against a lateral side 142a of the first locating portion 142 of the locating element 140. In this embodiment, the first locating portion 142 is a bump, and the movement of the locating element 140 is limited by the interference between the blocking element 122 and the lateral side 142a because the blocking element 122 leans against the lateral side 142a.

Figure 2B:
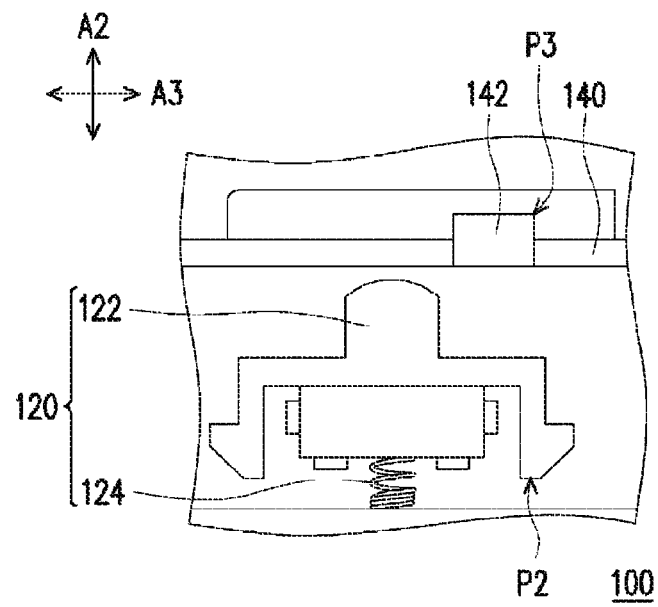
Figure 2C:
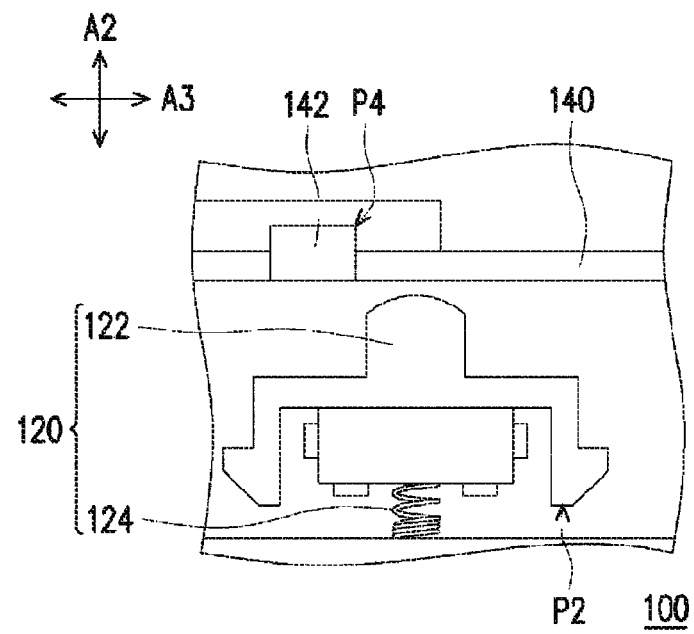

Subsequently, as shown in FIG. 2B, the blocking element 122 is attracted by the magnet (not shown in the figures), and thereby cause the blocking element 122 to move from the first position P1 to a second position P2 along the second axial direction A2. Then, please refer to FIG. 2C. When the blocking element 122 moves to the second position P2, the interference between the blocking component 120 and the first locating portion 142 is removed. At this point, the locating element 140 is configured for moving form the third position P3 to a fourth position P4 along the third axial direction A3 by the magnet (not shown in the figures) attracting the locating element 140, and the interference between the limiting element 160 and the second locating portion 144 is removed (the limiting element 160 is not shown in the figures). Moreover, during the moving process of the locating element 140, the magnet (not shown in the figures) and the blocking element 122 are still attracted to each other.

Figure 2D:
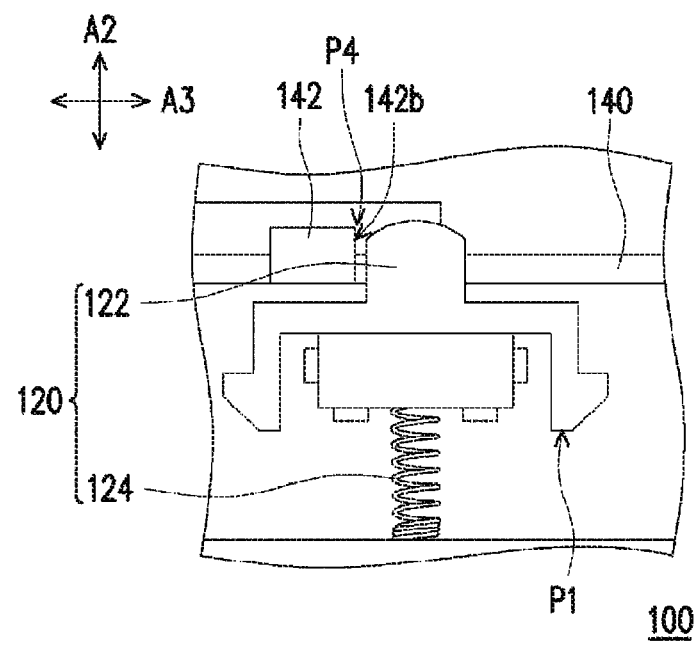

Then, the blocking element 122 attracted to the magnet is removed. At this point, as shown in FIG. 2D, the repositioning element 124 is configured for releasing the elastic potential energy generated during the movement from the first position P1 to the second position P2, so as to cause the blocking component 120 to reposition to the first position P1. When the blocking component 120 repositions to the first position P1, the blocking component 120 is interfered with the first locating portion 142, so as to limit the locating element 140 to move along the third axial direction A3. As shown in FIG. 2D, when the blocking component 120 returns to the first position P1, the blocking element 122 leans against the other lateral side 142b of the first locating portion 142 of the locating element 140.

Figure 3:
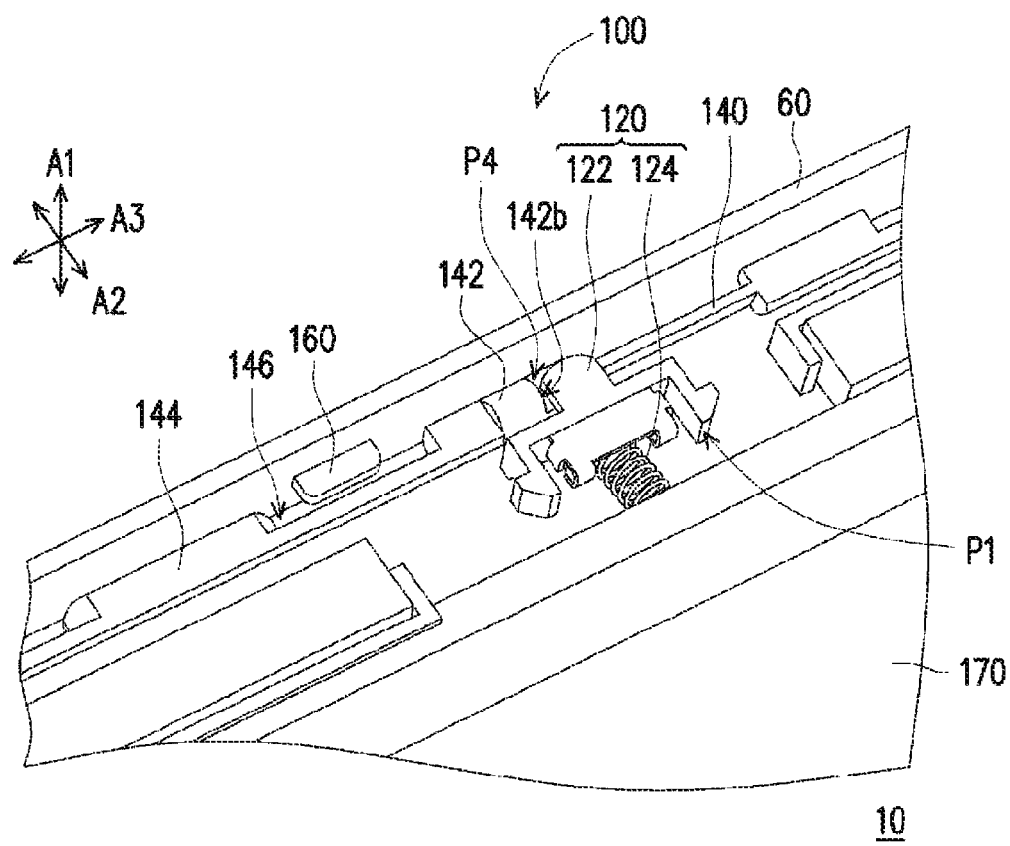
FIG. 3 is a perspective view of the movable fixing structure in FIG. 1A in the released condition.

FIG. 3 is a perspective view of the movable fixing structure in FIG. 1A in the released condition. The first casing 50 is omitted in order to show the movable fixing structure 100 clearly. Please refer to FIG. 3. After the locating element 140 moves from the third position P3 to the fourth position P4 along the third axial direction A3 and the repositioning element 142 causes the blocking component 120 to return from the second position P2 to the first position P1, the state of the movable fixing structure is shown in FIG. 3. Referring to FIG. 3, the locating element 140 has an opening 146 located next to the second locating portion 144. Thus, when the locating element 140 moves from the third position P3 to the fourth position P4 along the third axial direction A3, the opening 146 of the locating element 140 moves to the corresponding limiting element 160 accordingly, so that the interference between the limiting element 160 and the second locating portion 144 is removed. At this point, the restrictive relationship between the first casing 50 and the second casing 60 along the first axial direction A1 is removed, so the first casing 50 and the second casing 60 can move correspondingly.

In this embodiment, the limiting element 160 and the second casing 60 can be formed as a single unit. For example, the second casing 60 is made of plastics, and the limiting element 160 and the second casing 60 can be manufactured as a single unit through a injection molding process in order for cost reduction. However, the disclosure is not limited thereto. In other embodiments, the limiting element 160 may be assembled on the second casing 60 instead of being manufactured as a single unit with the second casing 60.

In this embodiment, the blocking component and the locating element 140 are configured for moving along the second axial direction A2 and the third axial direction A3 respectively. Hence, the space reserved for assembly and disassembly along the first axial direction A1 is not required. As a result, in this embodiment, the thickness of the second casing with the first casing 50 can be reduced due to the movable fixing structure 100, and the purpose of a slim design is thereby achieved. Moreover, in this embodiment, the assembly and disassembly between the first casing 50 and the second casing 60 via the movable fixing structure 100 are conducted through the magnet attracting the locating element 140 as well as the blocking component 120 and making them move. Consequently, the design of the elastic arm is not required so the outcomes of assembly and the disassembly with a reduced thickness are excellent.

Additionally, the rectangular locating element 140 is configured for being fastened with the limiting element 160 on the second casing 60, and the limiting element 160 can be arranged and disposed along the inner edge of the second casing 60. Therefore, the position of the locating element 140 only needs to be adjusted slightly in order to fasten the locating element 140 with the limiting element 160 or to detach the locating element 140 from the limiting element 160. As a result, the purpose of a rapid assembly of the first casing 50 and the second casing 60 is fulfilled.

According to above-mentioned embodiments, the movable fixing structure of the disclosure is configured for limiting the first casing and the second casing to move along a first axial direction relative to each other. In the movable fixing structure, the blocking component and the locating element are moving along the second axial direction and the third axial direction, instead of moving along the first axial direction, namely the thickness direction. Consequently, the space between the two casings can be used effectively and the utilization of space can be improved. Furthermore, since the magnet is used for moving the blocking component and the locating element, the assembly of the first casing and the second casing is conducted by the magnetic force instead of elastic force from the hook. The insufficient elastic force or the space required for accommodating the elastic arm, therefore, is avoided. Along with the improved utilization of space mentioned above, the convenience of assembly and disassembly under the condition of the reduced thickness in terms of the structure is achieved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A movable fixing structure configured for being disposed between a first casing and a second casing, the movable fixing structure being configured for causing the first casing to be combined with or detached from the second casing along a first axial direction, the movable fixing structure comprising:

a blocking component movably disposed on the first casing along a second axial direction, the blocking component being configured for moving between a first position and a second position;

a locating element having a first locating portion, a second locating portion and an opening located next to the second locating portion, the locating element being disposed on the first casing and configured for moving between a third position and a fourth position along a third axial direction, wherein the first axial direction, the second axial direction and the third axial direction are perpendicular to each other; and a limiting element disposed on the second casing and configured for interfering with the second locating portion on the first axial direction, wherein when the blocking component is at the first position, the locating element is limited at the third position by the blocking component and the locating element is interfered with the second locating portion by the blocking component so that the first casing is constrained to move away from the second casing along the first axial direction, and when the blocking component is at the second position, the locating element is configured for moving to the fourth position, so as to release the interference between the limiting element and the second locating portion;

wherein when the blocking component moves from the first position to the second position, the locating element is configured for moving from the third direction to the fourth direction along the third axial direction, so as to make the limiting element correspond to the opening and release the interference between the limiting element and the second locating portion.

2. The movable fixing structure according to claim 1, wherein the locating element is magnetic or has magnetic conductivity, and the locating element is a rectangular structure disposed along an edge of the first casing.

3. The movable fixing structure according to claim 1, wherein the blocking component comprises:

a blocking element, when the blocking element is at the first position, the blocking element is located on the motion path of the locating element; and a repositioning element connecting the blocking element and the first casing and is located between the blocking element and the first casing, the repositioning element causes the blocking element to move to the locating element along the second axial direction.

4. The movable fixing structure according to claim 3, wherein the blocking element is magnetic or has magnetic conductivity.

5. An electronic device, comprising:

a first casing;

a second casing configured for connecting with the first casing; and a movable fixing structure configured for being disposed between the first casing and the second casing, the movable fixing structure being configured for causing the first casing to combine with or detach from the second casing along a first axial direction, the fixing structure comprising:

a blocking component movably disposed on the first casing along a second axial direction, the blocking component being configured for moving between a first position and a second position;

a locating element having a first locating portion, a second locating portion and an opening located next to the second locating portion, the locating element being disposed on the first casing and configured for moving between a third position and a fourth position along a third axial direction, wherein the first axial direction, the second axial direction and the third axial direction are perpendicular to each other; and a limiting element disposed on the second casing and configured for interfering with the second locating portion on the first axial direction, wherein when the blocking component is at the first position, the locating element is limited at the third position by the blocking component and the locating element is interfered with the second locating portion by the blocking component, so that the first casing is constrained to move away from the second casing along the first axial direction, and when the blocking component is at the second position, the locating element is configured for moving to the fourth position, so as to release the interference between the limiting element and the second locating portion;

wherein when the blocking component moves from the first position to the second position, the locating element is configured for moving from the third direction to the fourth direction along the third axial direction, so as to make the limiting element correspond to the opening and release the interference between the limiting element and the second locating portion.

6. The electronic device according to claim 5, wherein the blocking component comprises:

a blocking element, wherein when the blocking component is at the first position, the blocking element is at the motion path of the locating element; and a repositioning element being connected with the blocking element and the first casing, the repositioning element causing the blocking element to move to the locating element along the second axial direction.

7. The electronic device according to claim 5, wherein the locating element and the blocking element are magnetic or have magnetic conductivity, and the locating element is a rectangular structure disposed along an edge of the first casing.

8. The electronic device according to claim 5, further comprising a display unit disposed on either the first casing or the second casing.

* * * * *